United States Patent
Fried et al.

(10) Patent No.: US 8,699,723 B2
(45) Date of Patent: Apr. 15, 2014

(54) AUDIO DEVICE VOLUME MANAGER USING MEASURED VOLUME PERCEIVED AT A FIRST AUDIO DEVICE TO CONTROL VOLUME GENERATION BY A SECOND AUDIO DEVICE

(75) Inventors: Eric P Fried, Austin, TX (US); Suresh Sabarathinam, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 12/839,439

(22) Filed: Jul. 20, 2010

(65) Prior Publication Data

US 2012/0020486 A1 Jan. 26, 2012

(51) Int. Cl.
*H03G 3/00* (2006.01)

(52) U.S. Cl.
USPC .............................. 381/104; 381/105; 381/77

(58) Field of Classification Search
USPC ............. 381/109, 104, 58, 105, 107, 103, 86; 455/212, 570; 379/102.02, 102.03, 379/202.01; 370/204, 206, 260; 700/94
See application file for complete search history.

(56) References Cited

U.S. PATENT DOCUMENTS

| | | | |
|---|---|---|---|
| 4,303,836 A | 12/1981 | Lyman | |
| 5,309,443 A | 5/1994 | Schorman | |
| 5,575,002 A | 11/1996 | Mulford | |
| 5,852,769 A * | 12/1998 | Ahmed et al. | 455/116 |
| 5,987,106 A | 11/1999 | Kitamura | |
| 5,995,827 A | 11/1999 | Gitlin | |
| 6,169,807 B1 * | 1/2001 | Sansur | 381/57 |
| 6,246,761 B1 | 6/2001 | Cuddy | |
| 6,351,639 B1 | 2/2002 | Motohash | |
| 6,370,366 B2 | 4/2002 | Roullet | |
| 6,678,362 B2 | 1/2004 | Hong | |
| 6,795,544 B1 | 9/2004 | D'Arey | |
| 6,952,471 B1 | 10/2005 | Cannon | |
| 7,110,558 B1 * | 9/2006 | Elliott | 381/105 |
| 7,630,887 B2 | 12/2009 | Erell | |
| 7,636,750 B2 | 12/2009 | Haldar | |
| 2003/0050720 A1 * | 3/2003 | Kolessar et al. | 700/94 |
| 2005/0063556 A1 * | 3/2005 | McEachen et al. | 381/104 |
| 2006/0099970 A1 | 5/2006 | Morgan | |
| 2006/0126866 A1 * | 6/2006 | Falcon | 381/104 |
| 2006/0147059 A1 | 7/2006 | Tang | |
| 2006/0153405 A1 | 7/2006 | Myers | |
| 2007/0173212 A1 * | 7/2007 | Mergler | 455/92 |

OTHER PUBLICATIONS

Electronics Zone—"Telephone Line Based Audio Muting and Light on Circuit", Electronics Zone, (downloaded from http://www.electronic-circuits-diagrams.com/telephonesimages/telephonesckt3.shtml on May 20, 2010).
TV Silencer—"TV-Silencer: A Wonderful Gift" (downloaded from http://www.tv-silencer.com/index.php? act=viewDoc&docId=8 on May 20, 2010) (Copyright 2007).

* cited by examiner

*Primary Examiner* — Vivian Chin
*Assistant Examiner* — Friedrich W Fahnert
(74) *Attorney, Agent, or Firm* — David Mims; Mark P Kahler

(57) ABSTRACT

An audio system includes a first audio device and a second audio device. A communications link connects the first and second audio devices together so that each may communicate with the other. The system includes an audio volume manager that varies the audio output level of the second audio device as a function of the perceived loudness of the second audio device as perceived at the first audio device.

5 Claims, 5 Drawing Sheets

400

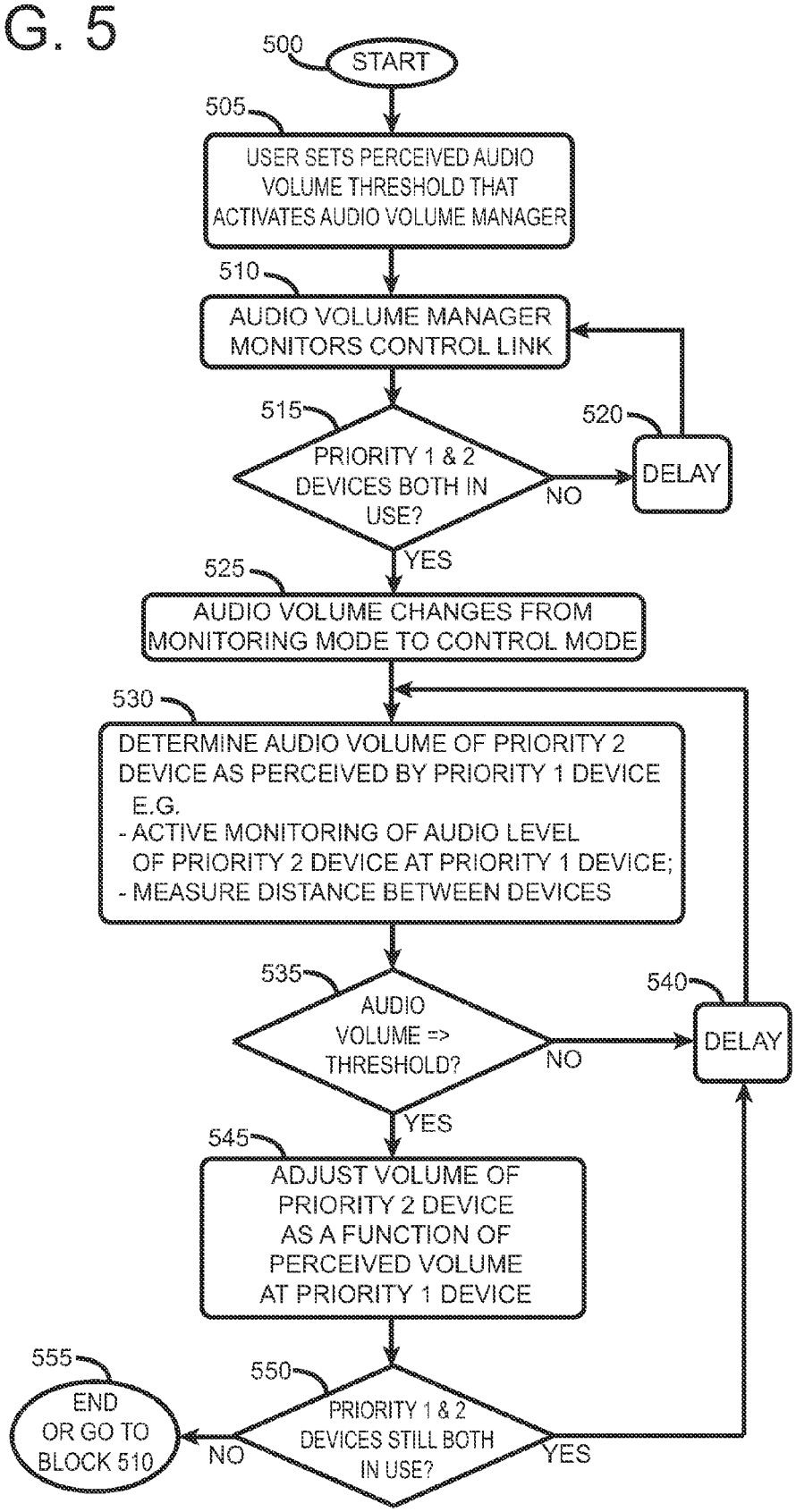

US 8,699,723 B2

AUDIO DEVICE VOLUME MANAGER USING MEASURED VOLUME PERCEIVED AT A FIRST AUDIO DEVICE TO CONTROL VOLUME GENERATION BY A SECOND AUDIO DEVICE

BACKGROUND

The disclosures herein relate generally to information handling systems (IHSs), and more specifically, to the management of the audio volume levels produced by multiple information handling systems that generate audio signals.

Modern households typically employ many different audio devices that members of the household use. These devices may include televisions, radio systems and high fidelity audio systems, media centers and other devices that tend to have fixed locations. These devices may also include handheld or mobile audio devices such as portable phones and cellular or mobile phones. All of these audio devices may compete to be heard by their respective users.

BRIEF SUMMARY

In another embodiment, an audio system is disclosed. The audio system includes a first priority audio device and a second priority audio device. The audio system also includes an audio volume manager that receives audio volume information of the first audio device that indicates a current audio volume of the second audio device as perceived at a first audio device, wherein the audio volume manager changes audio volume generated by the second audio device as a function of the current perceived audio volume of the second audio device as perceived at the first audio device.

In yet another embodiment, an audio volume manager computer program product is disclosed. The computer program product includes a computer readable storage medium. The computer program product includes first program instructions that receive audio volume information of a first audio device that indicates a current audio volume of a second audio device as perceived at the first audio device. The computer program product also includes second program instructions that change audio volume generated by the second audio device as a function of the current perceived audio volume of the second audio device as perceived at the first audio device. The first and second program instructions are stored on the computer readable storage medium.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 5 is a flowchart that shows process flow in a representative embodiment of the disclosed communication methodology with audio volume manager.

DETAILED DESCRIPTION

Modern homes, apartments and other structures often employ several different audio devices throughout. At times, audio that one audio device generates may conflict with audio that another audio device generates. In other words, these audio devices may compete to be heard by their respective users. In one scenario, the potential for conflict may be between audio devices with a fixed location and audio devices that are mobile within the home or other user environment. Examples of fixed location audio systems include televisions, radio systems, media centers and high fidelity audio systems. The audio from these often large and robust fixed audio devices may interfere with and overwhelm the audio from a much less powerful mobile audio device such as a portable phone or mobile/cellular phone.

In one embodiment, the disclosed system includes a mobile audio device such as a portable telephone and a fixed audio device such as a television set or entertainment system. A communication link connects the mobile audio device with the fixed audio device so that each audio device knows when the other audio device is in use. The fixed audio device, for example a television with display and speakers, is active when it turns on and generates an audio signal for users or listeners. The mobile audio device is inactive, i.e. in standby mode, while it waits for a phone call. While the mobile audio device is inactive in standby mode, the audio volume that the fixed audio device generates does not interfere with the user of the mobile audio device.

When the mobile audio device becomes active, such as when the user receives a phone call, the mobile audio device instructs a variable audio volume control in the fixed audio device to decrease volume to a predetermined level. The predetermined audio volume level that the fixed audio device exhibits depends on the loudness or volume of the audio signal of the fixed audio device as perceived by the mobile audio device. In one embodiment, the volume of the fixed audio device varies with the proximity of the mobile audio device to the fixed audio device. The closer the mobile audio device is to the fixed audio device, the quieter the audio output of the fixed audio device becomes. In other words, the audio output level of the fixed audio device varies directly with the distance between the mobile audio devices. As the user of the mobile audio device walks away from the fixed audio device after receiving a call, the audio output of the fixed audio device may gradually become louder and louder until the user of the mobile audio device is sufficiently far away from the fixed audio device to not find the competing audio level of the fixed audio device bothersome. To achieve this adaptive audio volume control, an audio volume manager may reside in the mobile audio device, the fixed audio device or an external information handling system (IHS)/controller that communicates with both audio devices, as discussed in more detail below.

Figure 1:
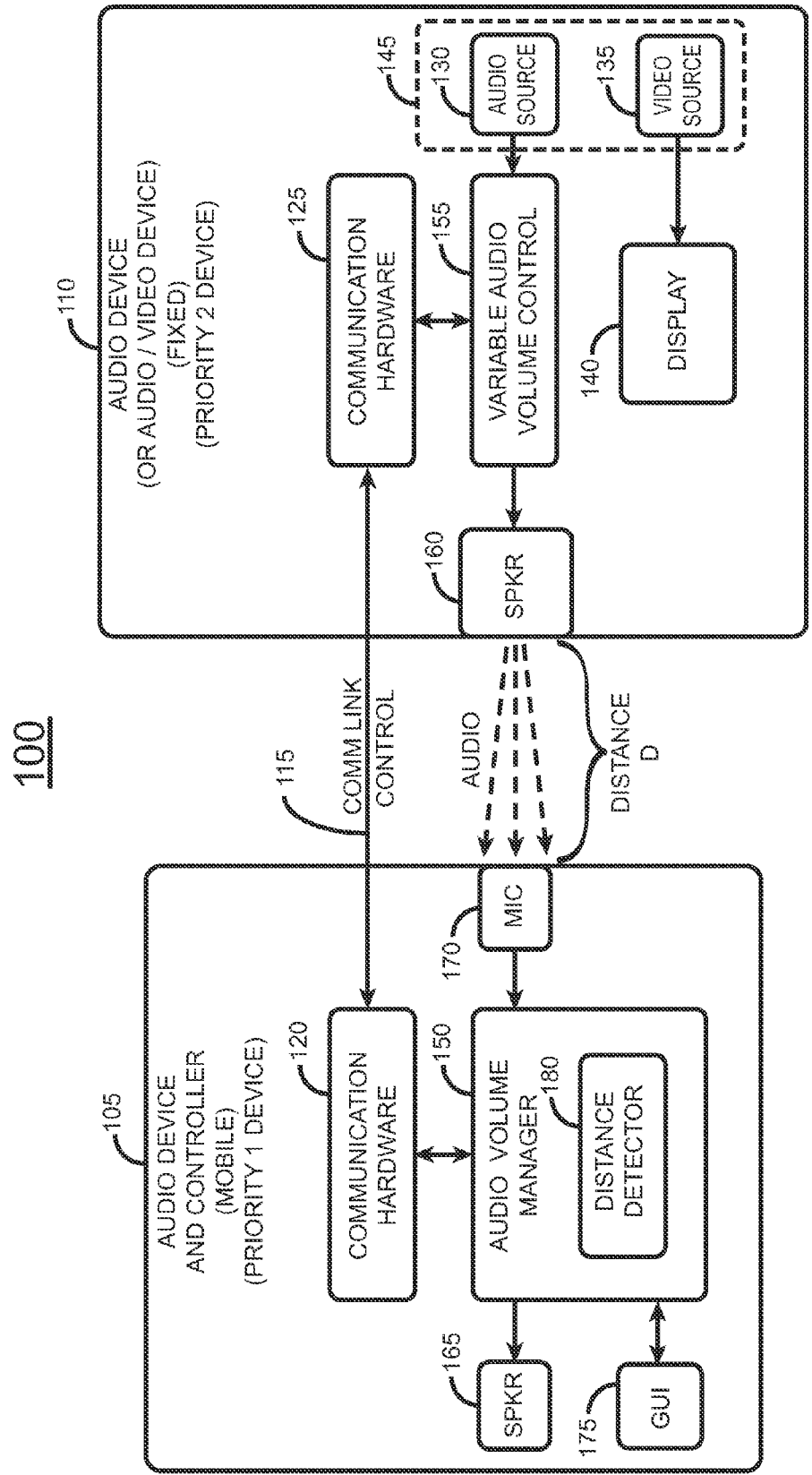
FIG. 1 is a block diagram of one embodiment of the disclosed system with an audio volume manager.

FIG. 1 shows a block diagram of one embodiment of the disclosed system 100 including an audio device 105 and an audio device 110. Audio device 105 may be a mobile audio device such as a handheld telephone or mobile phone. Audio device 110 may be a fixed audio device such as a television or media center. A communications link 115 couples or links communication hardware 120 of audio device 105 and communication hardware 125 of audio device 110 together so that each may communicate with the other. In this manner, control information, status information and other information may pass between audio device 105 and audio device 110.

In the following discussion, audio device 105 may be alternatively referred to as an audio device and controller because of the control it exerts over the audio volume of audio device 110, which may also be called the controlled device. Audio device 105 may also be referred to as a priority 1 device, while audio device 110 is a priority 2 device, because the audio signal output of audio device 105 has priority over the audio signal output of audio device 110. A used herein, the meaning of "priority" is that one audio device (e.g. priority 1 audio device 105) has a higher priority to have its audio heard by its user than the user of a lower priority audio device (e.g. priority 2 audio device 110) has to hear the audio of the low priority audio device. In one embodiment, audio device 110 includes an audio source 130 such as a compact disk (CD), DVD audio player or the audio portion of an audio video (A/V) program player or other source. Audio device 110 may optionally include a video source 135 that couples to a display 140. Device 110 may integrate audio source 130 and video source 135 together as A/V source 145, shown in dashed line in FIG. 1. Video source 135 may include sources such as network television, cable television, DVDs, the Internet and other sources.

Audio device 105 includes an audio volume manager 150 that communicates via communications link 115 with a variable audio volume control 155 in audio device 110 to control the current audio volume that loudspeaker 160 generates. Under the direction and control of audio volume manager 150 of audio device 105 (the priority 1 audio device), variable audio volume control 155 of audio device 110 (the priority 2 audio device) may decrease or increase the output audio volume of speaker 160. Audio device 105 includes a loudspeaker 165 and microphone 170 to enable the user listen and talk, respectively, via device 105 which may be a handheld telephone in one embodiment. Loudspeaker 165 and microphone 175 may be integrated in the same portable handset. A graphical user interface (GUI) 175 enables a user to interact with audio volume manager 150. A user may use GUI 175 to provide input to audio volume manager 150 and receive output from audio volume manager 150.

Audio device 105 may employ a number of different mechanisms to determine the current perceived loudness of the audio signal from audio device 110 as received at audio device 105. For example, audio device 105 may employ microphone 170 to directly measure the loudness or audio volume of audio device 110 as perceived at the location of audio device 105. Alternatively, audio device 105 may use distance detector 180 to measure the current distance, D, between audio device 105 and audio device 110 to indirectly determine the perceived loudness of the audio volume of audio device 110 as perceived at audio device 105. Embodiments of system 100 that employ microphone 170 to directly determine the perceived loudness of the audio volume of audio device 110 as perceived at audio device 105 need not employ a distance detector such as distance detector 180. In a direct determination embodiment, audio volume manager 150 uses microphone 170 to directly detect the perceived loudness of audio device 110 as perceived at audio device 105. Audio volume manager 155 then uses the current perceived loudness of audio device 110 at audio device 105 to control or regulate the loudness of audio device 110, thus in turn controlling the perceived loudness at device 105.

However, should a particular embodiment not include a microphone 170 to determine the perceived loudness, then distance detector 180 may indirectly determine the perceived loudness in the following manner. The perceived loudness, L, of the audio volume of audio device 110 as perceived at audio device 105 depends on the audio output power of audio device 110 and the distance, D, between audio device 105 and audio device 110, as given by Equation 1 below:

$$L = A*(P/D^2) \quad \text{EQUATION 1}$$

wherein A is a constant

Audio device 110 sends audio volume manager 150 the current output power, P, of audio device 110. Audio device 105 may use sonar, radar or other distance measuring techniques to determine the current distance, D, or range between the two audio devices. With the power P, the distance D and the constant A all being known by audio volume manager 150, audio volume manager 150 employs Equation 1 to determine the current perceived volume or loudness, L, of audio device 110 and audio device 105.

Using either the direct or indirect approach to determine the perceived loudness at audio device 105, as the current distance, D, becomes larger, the perceived loudness or audio volume of audio device 110 at audio device 105 decreases. The user of audio device 105 interacts with GUI 175 to calibrate audio device 105 with a user selectable audio volume threshold level. When audio device 105 activates, as during a phone call, audio volume manager 150 instructs variable audio volume control 155 to control and reduce the audio volume of audio device 110 to an acceptable perceived loudness at audio device 105 for the particular current distance, D, between the two audio devices. When audio device 105 and 110 are at the same location, such that the current distance, D, is essentially zero, then audio volume manager 150 of audio device 105 (the priority 1 audio device) may instruct the variable audio volume control 155 of audio device 110 to completely mute audio device 110. However, if the user of audio device 105 starts walking away from audio device 110 as he or she begins a phone call, the current distance, D, increases. Audio volume manager 150 perceives the volume of the audio signal from audio device 110 as decreasing with distance and in response increases the volume of audio device 110.

In the indirect perceived audio volume determination embodiment, the user may configure system 100 in the following manner. When the user configures system 100, the user adjusts the audio output power of audio device 110 to a power P. At configuration, system 100 discovers the particular current distance D between audio devices 105 and 110. Using this particular distance D, audio volume manager 150 uses Equation 1 to determine the perceived loudness $L_a$. $L_a$ is the perceived loudness at which attenuation becomes active for a particular calibration distance D. Audio volume manager 150 stores the value of $L_a$ for later use in controlling the audio output power of audio device 110.

When audio volume manager 150 activates to commence controlling the output volume of audio device 110, audio volume manager 150 instructs variable audio volume control 155 in audio device 110 to adjust the audio volume of audio device 110 in the following manner. Audio volume manager 150 employs Equation 2 below to determine the appropriate audio volume setting of audio device 110 so that the perceived loudness at audio device 105 becomes loudness, $L_a$, namely the configured attenuated perceived loudness.

$$P_a = (1/A)*L_a*D_a^2 \quad \text{EQUATION 2}$$

wherein A is a constant $P_i$, is the output power of audio device 110 when control of the audio output power is idle or inactive. In other words, $P_i$, is the output power of audio device 110 before an event that activates audio volume manager 150. Thus, the output power $P_i$, is not initially a factor. In one embodiment, as distance $D_a$ changes, audio volume manager 150 continuously recalculates power $P_a$ and audio volume manager 150 adjusts the audio output power of audio device 110 up to, but not above, its original setting $P_i$.

Figure 2:
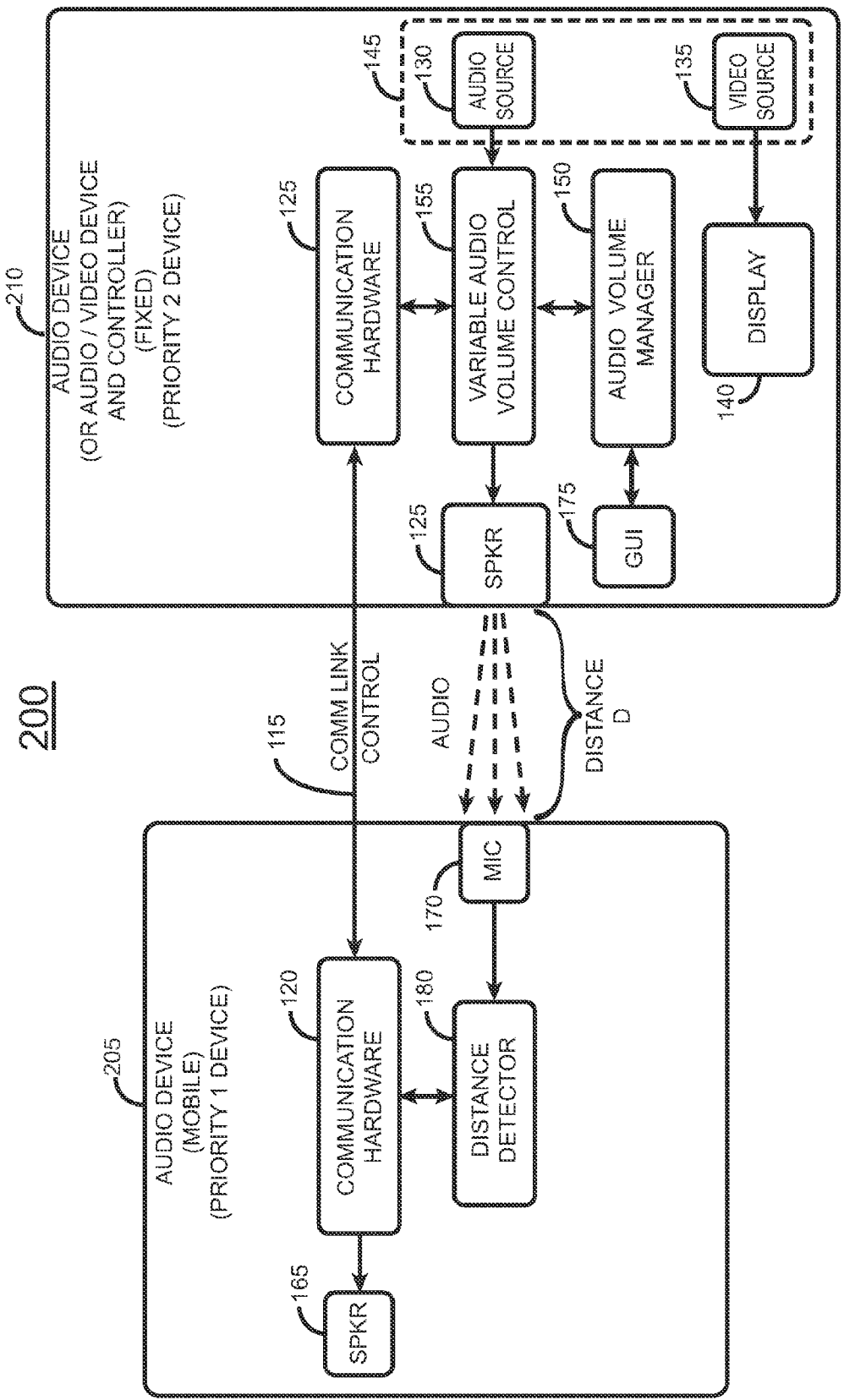
FIG. 2 is a block diagram of another embodiment of the disclosed system with an audio volume manager.

FIG. 2 is a block diagram of another embodiment of the disclosed system 200 including an audio device 205 and an audio device 210. System 200 includes many elements in common with system 100 of FIG. 1. When comparing system 200 of FIG. 2 with system 100 of FIG. 1, like numbers indicate like components. System 200 is similar to system 100 with some notable differences. System 200 includes the audio volume manager 150 within the priority 2 audio device 210, not the priority 1 audio device 205. However, in this particular embodiment, the priority 1 audio device 205 still includes the distance detector 180. Distance detector 180 determines the current distance, D, between audio devices 205 and 210 and reports distance information back to audio volume manager 150 in audio device 210 via communications link 115. Audio volume manager 150 then employs this distance information to control the audio output of speaker 125 in a manner similar to that discussed above with respect to system 100 of FIG. 1. In another alternative embodiment, the priority 2 audio device 210 may include both audio volume manager 150 and distance detector 180.

Figure 3:
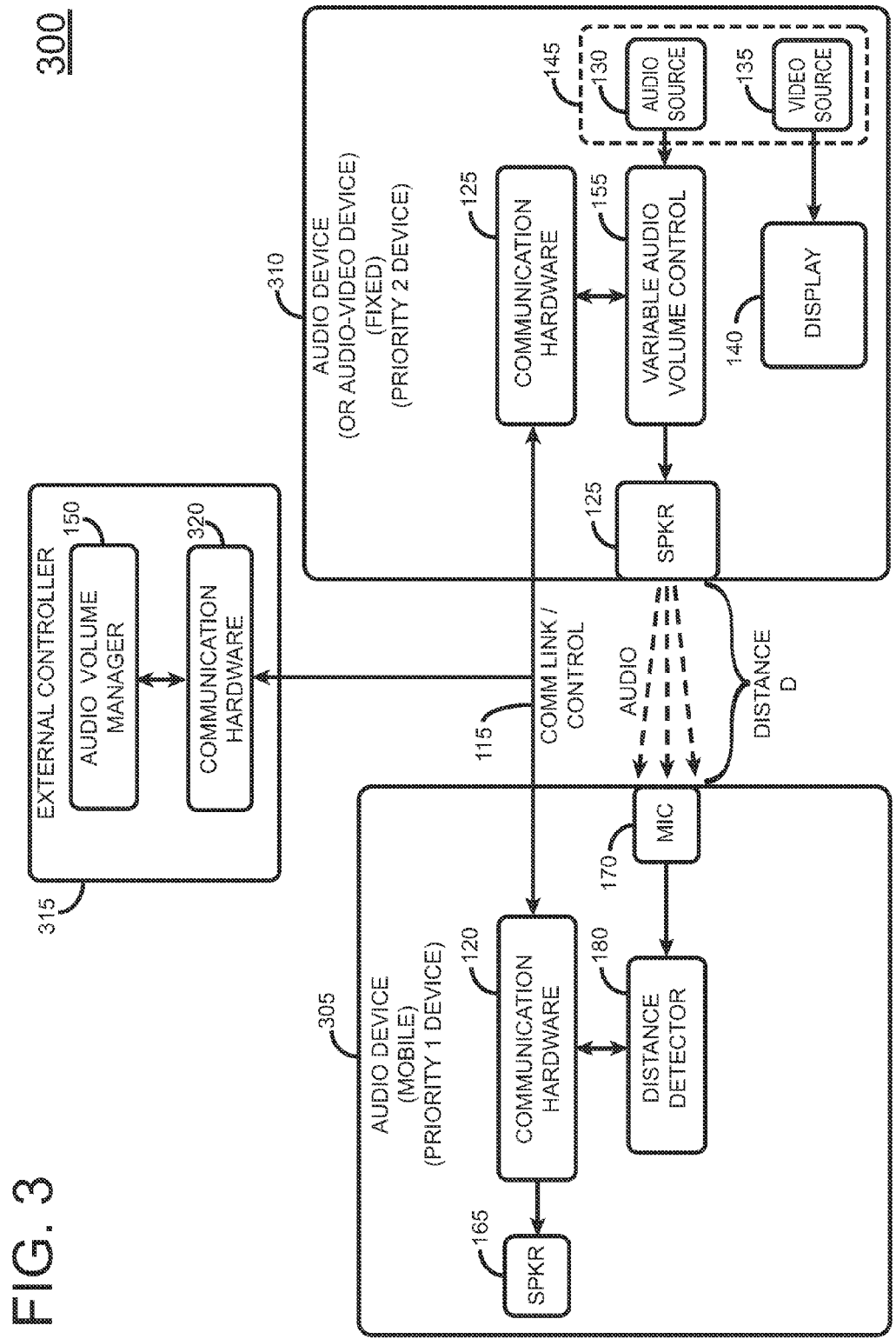
FIG. 3 is a block diagram of yet another embodiment of the disclosed system with an audio volume manager.

FIG. 3 is a block diagram of yet another embodiment of the disclosed system 300 including an audio device 305 and an audio device 310. System 300 includes many elements in common with system 100 of FIG. 1. When comparing system 300 of FIG. 3 with system 100 of FIG. 1, like numbers indicate like components. Rather than being integrated in either audio device 305 (the priority 1 audio device) or the audio device 310 (the priority 2 audio device), audio volume manager 150 is in an external controller or external IHS 315. This external audio volume manager 150 in external controller 315 communicates via communication hardware 320 and communication link 115 with audio device 305 from which it retrieves current distance information, D. External audio volume manager 150 in external controller 315 also communicates with variable audio volume control 155 to control the audio output volume of speaker 125, as already described above with respect to the embodiments of FIG. 1 and FIG. 2. Audio volume manager 150 in external controller 315 instructs variable audio volume control 155 in audio device 310 to set the audio output volume of loudspeaker 125 such that it increases as the distance, D, between the 2 audio devices increases.

Figure 4:
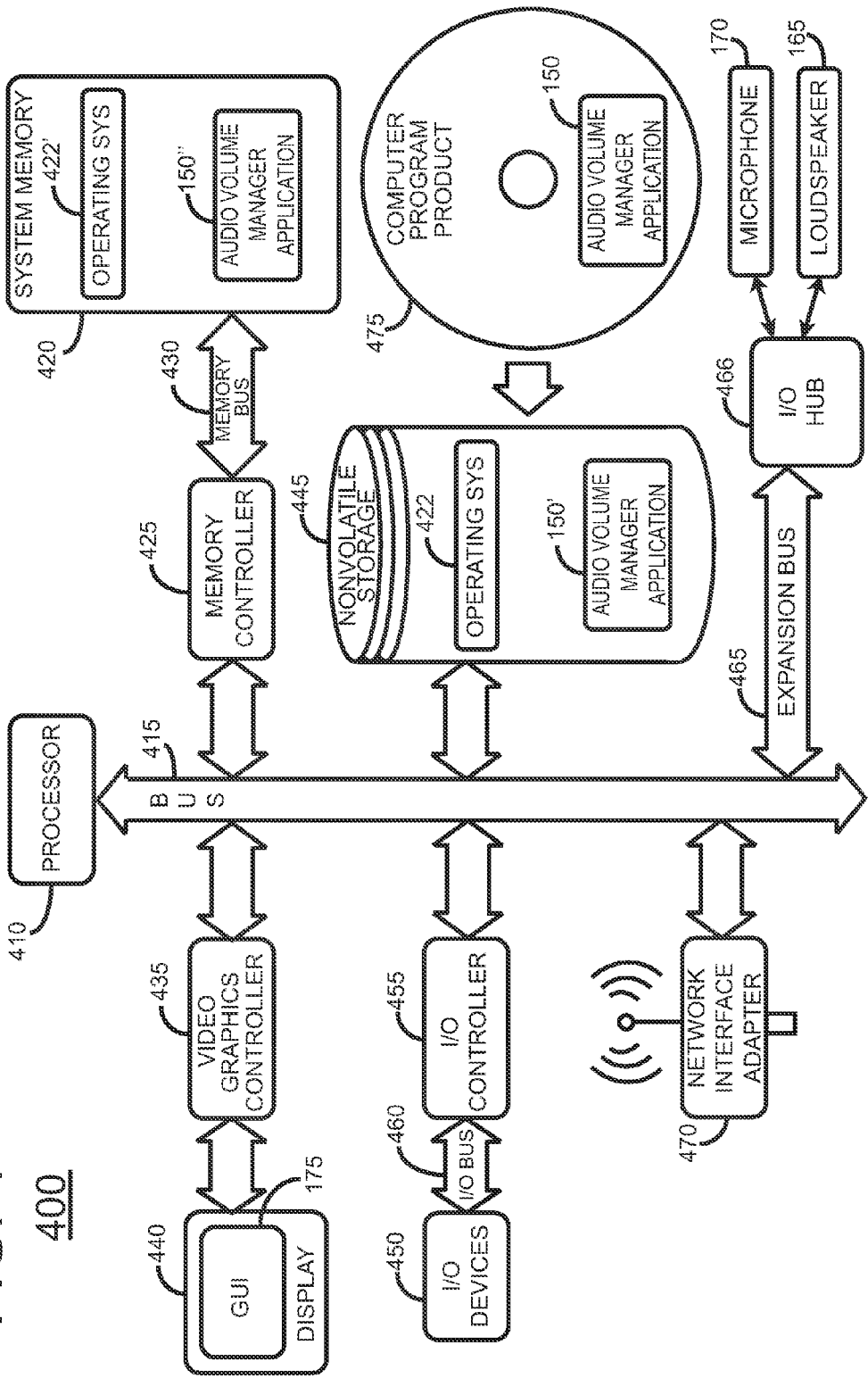
FIG. 4 is a block diagram of an information handling system (IHS) that may be employed as a communication device with audio volume manager in the disclosed system.

FIG. 4 is a block diagram of an information handling system (IHS) 400 that may be used as, or in cooperation with, a priority 1 audio device such as device 105 of FIG. 1, a priority 2 audio device such as device 210 of FIG. 2, or an external controller 315 of FIG. 3 to perform the above-described functions of audio volume manager 150. Audio volume manager 150 may be a software application. Alternatively, systems 100, 200 and 300 may employ firmware as audio volume manager 150. As seen in FIG. 4, IHS 400 includes an audio volume manager application 150. IHS 400 includes a processor 410 that may include multiple cores. IHS 400 processes, transfers, communicates, modifies, stores or otherwise handles information in digital form, analog form or other form. IHS 400 includes a bus 415 that couples processor 410 to system memory 420 via a memory controller 425 and memory bus 430. In one embodiment, system memory 420 is external to processor 410. System memory 420 may be a static random access memory (SRAM) array or a dynamic random access memory (DRAM) array. Processor 410 may also include local memory (not shown) such as L1 and L2 caches (not shown). A video graphics controller 435 couples display 440 to bus 415. IHS 400 presents a graphical user interface (GUI) 175 to the user on display 440. Nonvolatile storage 445, such as a hard disk drive, CD drive, DVD drive, or other nonvolatile storage couples to bus 415 to provide IHS 400 with permanent storage of information. I/O devices 450, such as a keyboard and a mouse pointing device, couple to bus 415 via I/O controller 455 and I/O bus 460.

One or more expansion busses 465, such as USB, IEEE 1394 bus, ATA, SATA, PCI, PCIE, DVI, HDMI and other busses, couple to bus 415 to facilitate the connection of peripherals and devices to IHS 400. An input/output hub 466, such as a USB hub, couples to expansion bus 465 to couple loudspeaker 165 and microphone 170 to expansion bus 465. A network interface adapter 470 couples to bus 415 to enable IHS 400 to connect by wire or wirelessly to other IHSs and devices. In this embodiment, network interface adapter 470 may also be called a network communication adapter, a network adapter, or communication hardware. While FIG. 4 shows one IHS that employs processor 410, the IHS may take many forms. For example, IHS 400 may take the form of a desktop, server, portable, laptop, notebook, netbook, tablet or other form factor computer or data processing system. IHS 400 may take still other form factors such as a gaming device, a personal digital assistant (PDA), a portable telephone device, a communication device or other devices that include a processor and memory.

IHS 400 includes a computer program product, namely audio manager application 150, on digital media 475 such as a CD, DVD or other media. In one embodiment, a designer, user or other entity installs audio manager application 150 on nonvolatile storage 445 to practice the disclosed audio manager methodology. In practice, IHS 400 may store an operating system 422 (OPERATING SYS) and audio manager application 150 on nonvolatile storage 445 as operating system 422 and audio manager application 150', respectively. When IHS 400 initializes, the IHS loads operating system 422 into system memory 420 for execution as operating system 422'. IHS 400 also loads audio manager application 150' into system memory 420 as audio manager application 150".

As will be appreciated by one skilled in the art, aspects of the disclosed audio manager methodology may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product, such as computer program product 475 embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the FIG. 4 flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart of FIG. 4 and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart of FIG. 4 described below.

The flowchart FIG. 4 illustrates the architecture, functionality, and operation of possible implementations of systems, methods and computer program products that perform network analysis in accordance with various embodiments of the present invention. In this regard, each block in the flowchart of FIG. 4 may represent a module, segment, or portion of code, which comprises one or more executable instructions for implementing the specified logical function(s). It should also be noted that, in some alternative implementations, the functions noted in the block may occur out of the order noted in FIG. 4. For example, two blocks shown in succession may, in fact, be executed substantially concurrently, or the blocks may sometimes be executed in the reverse order, depending upon the functionality involved. It will also be noted that each block of FIG. 4 and combinations of blocks in the block diagrams and/or flowchart illustration, can be implemented by special purpose hardware-based systems that perform the specified functions or acts, or combinations of special purpose hardware and computer instructions.

FIG. 5 is a flowchart that shows process flow in one embodiment of the disclosed system. For discussion purposes, this flowchart applies to system 100 of FIG. 1 and further applies to systems 200 and 300 as well. Process flow commences with start block 500 at which priority 1 audio device 105 and priority 2 audio device 110 initialize. The GUI 175 offers the user the opportunity to set a perceived audio volume threshold at the priority 1 audio device 105 that activates audio volume manager 150, as per block 505. In one embodiment, the perceived audio volume at priority 1 audio device 105 received from the priority 2 audio device 110 must reach this perceived audio volume threshold level before the audio volume manager 150 activates and commences managing the volume of the priority 2 audio device 110 Audio devices 105 and 110 exchange status information with one another via communications link 115 to let each know when the other is in use. For example, priority 1 audio device 105 sends a "priority 1 device in use" signal to priority 2 audio device 110 when the priority 1 device is in use, such as during a phone call. The priority 2 audio device 110 sends a "priority 2 device in use" signal to priority 1 audio device 105 when the priority 2 device is in use, such as while watching a movie on display 140.

In one embodiment, audio volume manager 150 in priority 1 audio device 105 operates in an inactive "monitoring mode" to monitor communication link 115, as per block 510, so that audio volume manager 150 can determine if both the priority 1 and priority 2 audio devices are simultaneously in use, as per decision block 515. If audio volume manager 150 determines that both the priority 1 and priority 2 audio devices are not currently in use, then after a predetermined time delay at block 520, audio volume manager 150 again monitors communication link 115. When audio volume manager 525 determines at decision block 515 that both the priority 1 and priority 2 audio devices are currently in use, then audio volume manager 150 changes modes from its "monitoring mode" to a "control mode", as per block 525. As discussed below in more detail, in "control mode", audio volume manager 150 adjusts the perceived volume of the priority 2 audio device at the priority 1 audio device.

As part of this process, the audio volume manager 150 determines the audio volume of the priority 2 audio device as perceived by the priority 1 audio device, as per block 530. For example, audio volume manager 150 in priority 2 audio device 110 may actively monitor the audio volume level at microphone 170 that perceives the audio signal from speaker 160 of priority 2 audio device 110. Alternatively, the audio volume manager 150 may access distance detector 180 to determine the current distance, D, between priority 1 audio device 105 and priority 2 audio device 110.

Audio volume manager 150 performs a test to determine if the currently perceived audio volume level at the priority 1 audio device 105 equals or exceeds the user-set volume threshold level, as per decision block 535. If the currently perceived audio level at the priority 1 audio device 105 does not reach this threshold, then after a predetermined delay at block 540, audio volume manager 150 again determines the perceived audio volume from the priority 2 audio device as received at the priority 1 audio device. However, if the audio volume manager 150 now determines that the perceived audio volume from the priority 2 audio device as received at the priority 1 audio device does exceed the threshold volume level, then audio volume manager 150 activates and adjusts the volume that speaker 160 generates, as per block 545. More particularly, the audio volume manager 150 may instruct variable audio volume control 155 to substantially reduce volume or completely mute if the perceived audio level at the priority 1 audio device is very high. Audio volume manager 150 determines if both the priority 1 audio device and the priority 2 audio device are still in use, as per decision block 550. If both audio devices continue to be In use, then after a predetermined delay 540, audio volume manager 150 again determines the audio volume of the priority 2 audio device as perceived by the priority 1 audio device. Audio volume manager 150 again performs the audio volume threshold test of decision block 535 and another audio volume adjustment in response thereto if the threshold is still met.

In this manner, if the user of the priority 1 audio device walks away from the priority 2 audio device, the perceived volume level from the priority 2 audio device at the priority 1 decreases. In response to this decrease in the perceived audio volume level at the priority 1 audio device, the priority 2 audio device gradually increases its audio volume output until the user of the priority 1 audio device is sufficiently far away that neither audio device interferes with the other. In other words, the users of the respective audio devices can operate their devices with a sufficient distance between the devices that one does not bother or interfere with the other. When decision block 550 determines that both the priority 1 audio device and the priority 2 audio device are no longer both in simultaneous use, then the process ends or returns to monitoring the communication link 115 at block 510, as desired. In this manner, system 100, 200 and 300 may mitigate audio interference between the users of the priority 1 and priority 2 audio devices.

In an alternative embodiment, audio volume manager 150 may adjust the volume of audio device 110 as the user of audio device 105 moves further away from and closer to audio device 110, even when audio device 105 is inactive. In this embodiment, the user of mobile device 105 is also a user of fixed audio device 110. To make it easier for the user to hear audio device 110 as he or she moves away from audio device 110, audio volume manager 150 increases the audio volume of audio device 110 as perceived at mobile device 105 as the perceived volume of audio device 110 at mobile device 105 decreases. This serves to maintain the volume of audio device 110 that the user hears as the user moves further and further away from audio device 110, up to a predetermined maximum volume. Audio volume manager 150 may perform this volume control function via direct measurement of the perceived volume of audio device 110 at mobile device 105 via microphone 170, or indirectly by using the distance measurement technique for determining perceived volume discussed above. In this embodiment, audio device 105 and audio device 110 need not be simultaneously active.

As will be appreciated by one skilled in the art, aspects of the disclosed memory management technology may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
a first audio device including an audio volume manager;
a second audio device including a variable audio volume control that is responsive to the audio volume manager in the first audio device; and
a communication control link between the first audio device and the second audio device that enables the audio volume manager in the first audio device to send control information to the variable audio volume control in the second audio device;
the first audio device including a microphone, coupled to the audio volume manager, that directly measures a current audio volume of the second audio device as perceived at the first audio device, the audio volume manager sending control information via the communication control link to the variable audio volume control of the second audio device to instruct the second audio device to decrease the audio volume of the second audio device to a predetermined audio volume level that is a function of the current audio volume of the second audio device as perceived at the first audio device by the audio volume manager, wherein the audio volume manager receives status information that indicates when the first audio device and the second audio device are simultaneously in use, and wherein the audio volume manager switches from a monitoring mode to a control mode in response to the status information indicating that the first audio device and the second audio device are simultaneously in use, and wherein while in the control mode the second audio device decreases the audio volume of the second audio device to the predetermined audio volume level, the audio volume manager returning to the monitoring mode when the status information indicates that the first audio device and the second audio device are no longer simultaneously in use.

2. The system of claim 1, wherein the audio manager increases the audio volume generated by the second audio device as the current perceived volume of the second audio device as perceived by the first audio device decreases.

3. The system of claim 1, wherein the audio volume manager receives a user selectable threshold audio volume level setting that activates the audio volume manager to control the audio volume of the second audio device when the current perceived volume of the second audio device as perceived by the first audio device reaches this user selectable threshold audio volume level.

4. The system of claim 1, wherein the audio volume manager switches from the control mode to the monitoring mode when the status information indicates that the first audio device and the second audio device are not currently simultaneously in use.

5. The system of claim 1, further comprising repeating the receiving of status information, the receiving of audio volume information and the changing of audio volume generated by the second audio device at predetermined time intervals.

* * * * *